US012795929B2

(12) United States Patent
Kim et al.

(10) Patent No.: US 12,795,929 B2
(45) Date of Patent: Nov. 10, 2026

(54) VERTICAL NAND FLASH MEMORY DEVICE

(71) Applicant: Samsung Electronics Co., Ltd., Suwon-si (KR)

(72) Inventors: Kyunghun Kim, Suwon-si (KR); Sunho Kim, Suwon-si (KR); Seyun Kim, Suwon-si (KR); Hyungyung Kim, Suwon-si (KR); Seungyeul Yang, Suwon-si (KR); Gukhyon Yon, Hwaseong-si (KR); Minhyun Lee, Suwon-si (KR); Seokhoon Choi, Suwon-si (KR); Hoseok Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 351 days.

(21) Appl. No.: 18/322,365

(22) Filed: May 23, 2023

(65) Prior Publication Data

US 2024/0215249 A1 Jun. 27, 2024

(30) Foreign Application Priority Data

Dec. 22, 2022 (KR) ........................ 10-2022-0182168

(51) Int. Cl.
*H10B 43/35* (2023.01)
*H10B 43/27* (2023.01)

(52) U.S. Cl.
CPC ............. *H10B 43/35* (2023.02); *H10B 43/27* (2023.02)

(58) Field of Classification Search
CPC ........ H10B 43/35; H10B 43/27; H10B 43/30; H10D 30/6891; H10D 30/693; H10D 30/69; H10D 30/694
See application file for complete search history.

(56) References Cited

U.S. PATENT DOCUMENTS

| | | | |
|---|---|---|---|
| 8,008,722 | B2 | 8/2011 | Kim et al. |
| 8,390,054 | B2 | 3/2013 | Ino et al. |
| 8,415,674 | B2 | 4/2013 | Lim et al. |
| 8,427,865 | B2 | 4/2013 | Shima et al. |
| 8,460,998 | B2 | 6/2013 | Kim et al. |
| 8,513,729 | B2 | 8/2013 | Choe et al. |
| 8,907,398 | B2 | 12/2014 | Yun et al. |

(Continued)

FOREIGN PATENT DOCUMENTS

| | | | |
|---|---|---|---|
| CN | 101800169 A | 8/2010 | |
| CN | 113035882 A * | 6/2021 | ............. H10B 43/30 |

(Continued)

OTHER PUBLICATIONS

Extended European Search Report dated May 22, 2024 for corresponding European Patent Application No. 23187580.8.

(Continued)

*Primary Examiner* — Mohammed Shamsuzzaman
(74) *Attorney, Agent, or Firm* — Harness, Dickey & Pierce, P.L.C.

(57) ABSTRACT

A vertical NAND flash memory device may include a plurality of cell arrays. Each of the plurality of cell arrays may include a channel layer, a charge trap layer on the channel layer, and a plurality of gate electrodes on the charge trap layer. The charge trap layer may include silicon oxynitride comprising a metal. The metal may include at least one of Ga or In.

15 Claims, 14 Drawing Sheets

(56) References Cited

U.S. PATENT DOCUMENTS

| | | | | |
|---|---|---|---|---|
| 9,093,369 | B2 | 7/2015 | Shin et al. | |
| 9,293,335 | B2 | 3/2016 | Kim et al. | |
| 9,356,035 | B2 | 5/2016 | Ramkumar et al. | |
| 9,449,985 | B1 | 9/2016 | Rabkin et al. | |
| 9,947,685 | B2 | 4/2018 | Fujii et al. | |
| 10,636,807 | B2 | 4/2020 | Itokawa et al. | |
| 10,651,195 | B2 | 5/2020 | Lee et al. | |
| 2011/0266611 | A1 | 11/2011 | Kim et al. | |
| 2017/0263640 | A1* | 9/2017 | Takashima | H10B 43/27 |
| 2018/0122959 | A1 | 5/2018 | Calka et al. | |
| 2019/0252612 | A1* | 8/2019 | Tortorelli | H10N 70/063 |
| 2019/0267396 | A1 | 8/2019 | Daycock et al. | |
| 2021/0193845 | A1 | 6/2021 | Siddik et al. | |
| 2021/0257378 | A1 | 8/2021 | Ueda et al. | |
| 2022/0238672 | A1 | 7/2022 | Lee et al. | |
| 2022/0319602 | A1 | 10/2022 | Lee et al. | |
| 2022/0320135 | A1 | 10/2022 | Oh et al. | |
| 2025/0098171 | A1* | 3/2025 | Kim | H10B 43/30 |

FOREIGN PATENT DOCUMENTS

| | | | | | |
|---|---|---|---|---|---|
| CN | 114551341 | A | * | 5/2022 | H01L 21/76895 |
| KR | 10-2022-0107931 | A | | 8/2022 | |

OTHER PUBLICATIONS

Fei Wang et al., "Charge Loss Induced by Defects of Transition Layer in Charge-Trap 3D Nand Flash Memory", IEEE Access, 9, 47391-47398, Mar. 31, 2021.

Fei Wang et al., "Metallic doping: a new strategy for suppressing shallow-trap centers in vertically stacked charge-trapping flash memories" Fei Wang et al.2020 Appl. Phys. Express in press https://doi.org/10.35848/1882-0786/ab7e0b (accepted manuscript). Fei Wang et al 2020 Appl. Phys. Express 13 044001 (Abstract only), https://iopscience.iop.org/article/10.35848/1882-0786/ab7e0b.

Korean Office Action dated Jul. 14, 2026 for corresponding Korean Application No. 10-2022-0182168, and English-language translation thereof.

* cited by examiner

VERTICAL NAND FLASH MEMORY DEVICE

CROSS-REFERENCE TO RELATED APPLICATION

This application is based on and claims priority under 35 U.S.C. § 119 to Korean Patent Application No. 10-2022-0182168, filed on Dec. 22, 2022, in the Korean Intellectual Property Office, the disclosure of which is incorporated by reference herein in its entirety.

BACKGROUND

1. Field

The disclosure relates to a vertical NAND flash memory device.

2. Description of the Related Art

As the hard disks of the related art have been replaced by solid state drives (SSDs), NAND flash memory devices, which are non-volatile memory devices, have become widely commercialized. Recently, a vertical NAND flash memory device in which a plurality of memory cells are stacked in a direction perpendicular to a substrate has been developed in accordance with miniaturization and high integration.

In a vertical NAND flash memory device, a lateral charge spreading between memory cells may occur due to an increase in the number of stacked stages and a decrease in a height of memory cells, and such a lateral charge spreading may deteriorate the charge retention of memory cells.

SUMMARY

Provided is a vertical NAND flash memory device.

Additional aspects will be set forth in part in the description which follows and, in part, will be apparent from the description, or may be learned by practice of the presented embodiments of the disclosure.

According to an example embodiment, a vertical NAND flash memory may device include a plurality of cell arrays. Each of the plurality of cell arrays may include a channel layer, a charge trap layer on the channel layer, and a plurality of gate electrodes on the charge trap layer. The charge trap layer may include silicon oxynitride including metal. The metal may include at least one of Ga or In.

In some embodiments, a contact of the metal in the charge trap layer may be about 0.5 at % to about 20 at %. The content of the metal in the charge trap layer may be about 8 at % to about 16 at %.

In some embodiments, the metal and silicon may be uniformly distributed in the charge trap layer or the metal and silicon may be distributed in a layer-by-layer structure in the charge trap layer.

In some embodiments, the vertical NAND flash memory device may further include a substrate. Each of the plurality of cell arrays may be vertically on the substrate.

In some embodiments, an inside of the channel layer may include a channel hole extending in a direction perpendicular to the substrate.

In some embodiments, in each of the plurality of cell arrays, the channel hole may be filled with a filling insulating layer.

In some embodiments, the channel layer and the charge trap layer each may have a cylindrical shape and may surround the channel hole.

In some embodiments, in each of the plurality of cell arrays, a tunneling barrier layer may be between the channel layer and the charge trap layer.

In some embodiments, in each of the plurality of cell arrays, the plurality of gate electrodes may be spaced apart from each other in a direction perpendicular to the substrate, and each of the plurality of gate electrodes may surround the charge trap layer.

In some embodiments, in each of the plurality of cell arrays, a blocking insulating layer may be between the charge trap layer and each of the plurality of gate electrodes.

In some embodiments, an electronic device may include the vertical NAND flash memory device described above.

According to an example embodiment, a vertical NAND flash memory device includes a plurality of cell arrays. Each of the plurality of cell arrays includes a channel layer, a charge trap layer on the channel layer, and a plurality of gate electrodes on the charge trap layer. The charge trap layer may include silicon nitride including metal, and a plurality of gate electrodes provided on the charge trap layer, and the metal may include at least one of Ga or In.

In some embodiments, a content of the metal in the charge trap layer may be about 0.5 at % to about 20 at %.

In some embodiments, the metal and silicon may be uniformly distributed in the charge trap layer or the metal and silicon may be distributed in a layer-by-layer structure in the charge trap layer.

In some embodiments, the vertical NAND flash memory device may further include a substrate. Each of the plurality of cell arrays may be vertically on the substrate.

In some embodiments, an inside of the channel layer may include a channel hole extending in a direction perpendicular to the substrate. The channel layer and the charge trap layer each may have a cylindrical shape and may surround the channel hole.

In some embodiments, in each of the plurality of cell arrays, a tunneling barrier layer may be between the channel layer and the charge trap layer, and a blocking insulating layer may be between the charge trap layer and each of the plurality of gate electrodes.

In some embodiments, in each of the plurality of cell arrays, plurality of gate electrodes may be provided to be spaced apart from each other in a direction perpendicular to the substrate, and each of the plurality of gate electrodes may surround the charge trap layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
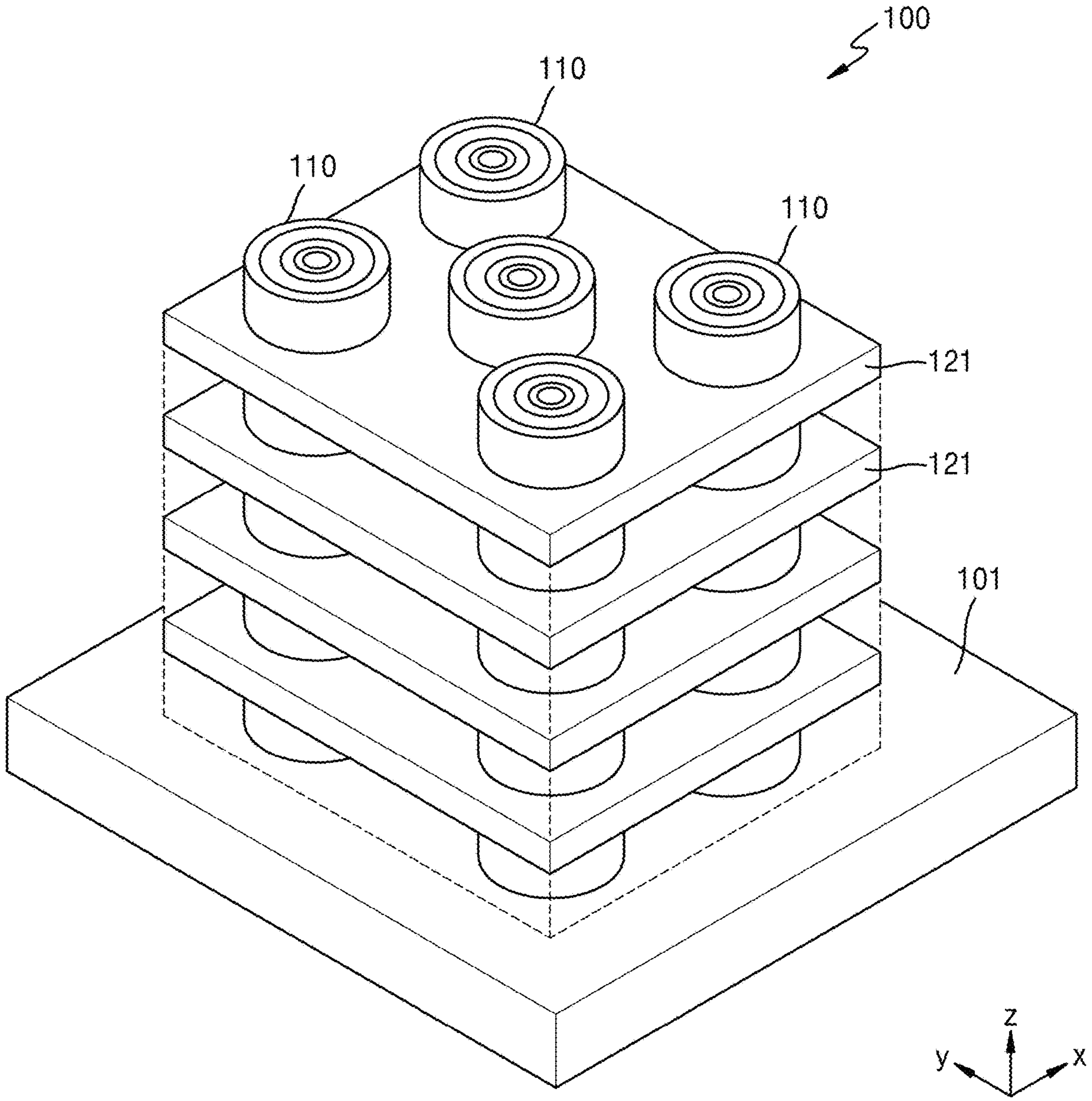
FIG. 1 is a perspective view schematically illustrating a vertical NAND flash memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., +10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes. When ranges are specified, the range includes all values therebetween such as increments of 0.1%.

Hereinafter, embodiments will be described in detail with reference to the accompanying drawings. Like reference numerals in the drawings denote like elements, and the size of each element in the drawings may be exaggerated for clarity and convenience of description. Meanwhile, embodiments described below are merely examples, and various modifications may be made from these embodiments.

Hereinafter, what is described as "above" or "on" may include those directly on, underneath, left, and right in contact, as well as above, below, left, and right in non-contact. The singular forms are intended to include the plural forms as well, unless the context clearly indicates otherwise. Also, when a part "includes" any element, it means that the part may further include other elements, rather than excluding other elements, unless otherwise stated.

The term "the" and the similar indicative terms may be used in both the singular and the plural. If there is no explicit description of the order of steps constituting a method or no contrary description thereto, these steps may be performed in an appropriate order, and are not limited to the order described.

In addition, the terms ". . . unit", "module", etc. described herein mean a unit that processes at least one function or operation, may be implemented as hardware or software, or may be implemented as a combination of hardware and software.

Connections of lines or connection members between elements shown in the drawings are illustrative of functional connections and/or physical or circuitry connections, and may be replaced in an actual device, or may be represented as additional various functional connections, physical connections, or circuitry connections.

The use of all examples or example terms is merely for describing technical concepts in detail, and the scope thereof is not limited by these examples or example terms unless limited by claims.

FIG. 1 is a perspective view schematically illustrating a vertical NAND flash memory device 100 according to an embodiment.

Referring to FIG. 1, the vertical NAND flash memory device 100 includes a plurality of cell arrays 110 disposed on a substrate 101. Here, each cell array 110 may be provided to extend in a direction perpendicular to the substrate 101 (z-axis direction in FIG. 1). The plurality of cell arrays 110 may be disposed on the substrate 101 in various forms.

Figure 2:
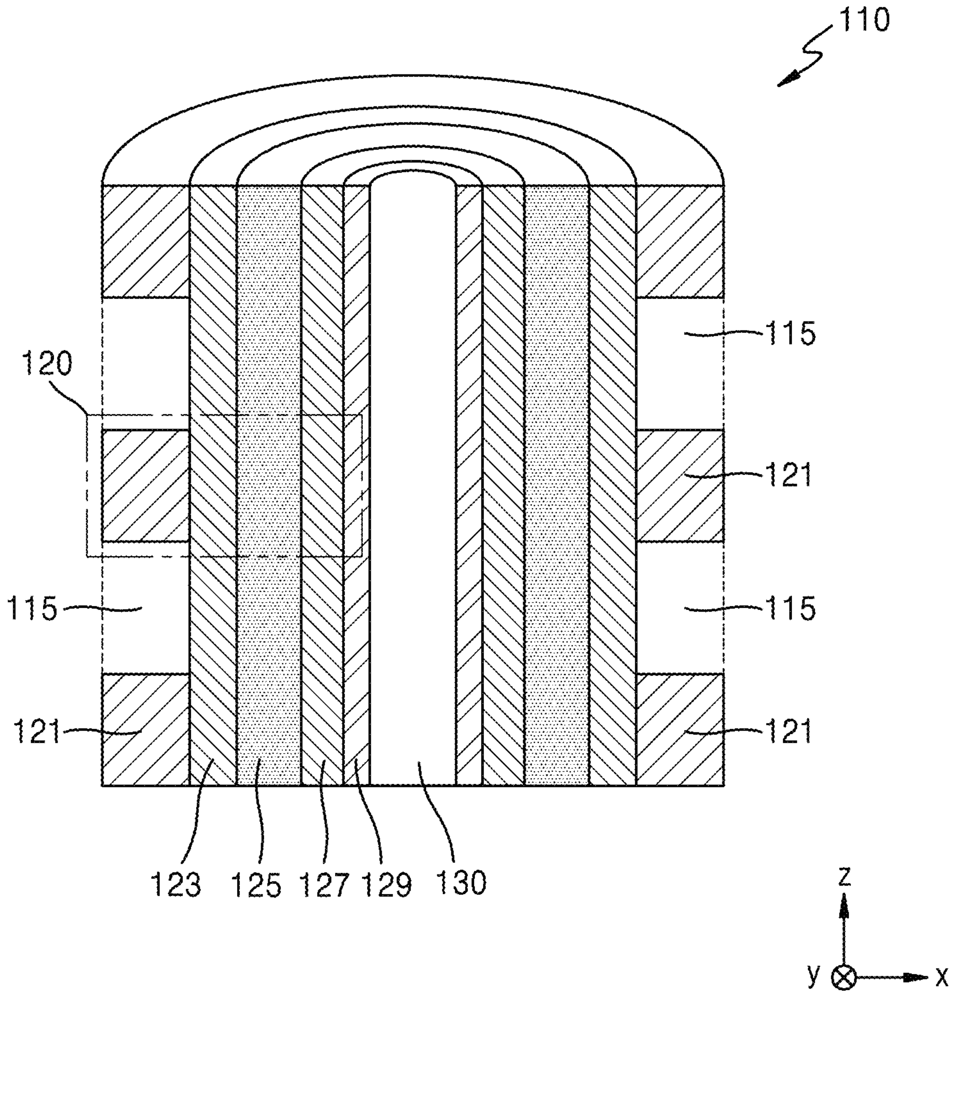
FIG. 2 is a cross-sectional view of a cell array shown in FIG. 1.
Figure 3:
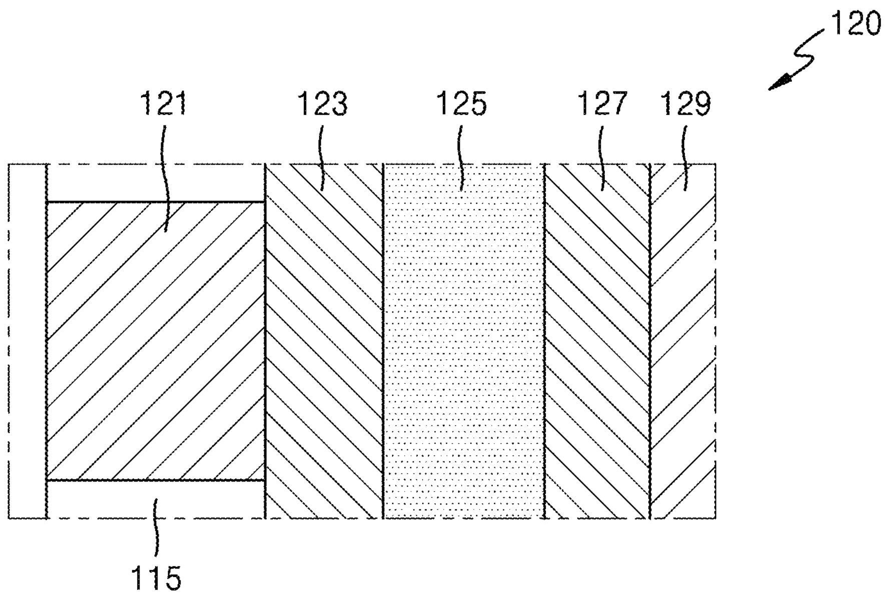
FIG. 3 is an enlarged view of a main portion of a memory cell shown in FIG. 2.

FIG. 2 is a cross-sectional view of each cell array 110 shown in FIG. 1, and FIG. 3 is an enlarged view of a main portion 120 of a memory cell shown in FIG. 2.

Referring to FIGS. 1 and 2, the cell array 110 includes a plurality of memory cells stacked in a direction (z-axis direction) perpendicular to the substrate 101. The cell array 110 includes a plurality of gate electrodes 121 spaced apart from each other and stacked in a direction perpendicular to the substrate 101, and a blocking insulating layer 123, a charge trap layer 125, a tunneling barrier layer 127, and a channel layer 129 sequentially provided inside the gate electrodes 121 parallel to the substrate 101. Here, each of the blocking insulating layer 123, the charge trap layer 125, the tunneling barrier layer 127, and the channel layer 129 may be provided to extend vertically on the substrate 101 and be shared by a plurality of memory cells.

Each memory cell may include a certain gate electrode 121, the blocking insulating layer 123, the charge trap layer 125, the tunneling barrier layer 127, and the channel layer 129 provided at positions corresponding to the gate electrode 121. A source and a drain may be provided in the channel layer 129 positioned below and above each memory cell, and a channel corresponding to the gate electrode 121 may be formed in the channel layer 129 between the source and drain. When a certain voltage is applied to the gate electrode 121 in each memory cell, charges flowing between the source and the drain in the channel layer 129 corresponding to the gate electrode 121 may pass through the tunneling barrier layer 127 and be trapped in the charge trap layer 125 so that information may be stored.

Interlayer insulating layers 115 and gate electrodes 121 are alternately stacked on the substrate 101 in a direction perpendicular to the substrate 101. Each interlayer insulating layer 115 and each gate electrode 121 may be provided in parallel on the substrate 101. The substrate 101 may include various materials. For example, the substrate 110 may include a single crystal silicon substrate, a compound semiconductor substrate, or a silicon on insulator (SOI) substrate, but is not limited thereto. In addition, the substrate 101 may further include, for example, an impurity region by doping, an electronic device such as a transistor, or a periphery circuit selecting and controlling memory cells storing data.

The gate electrode 121 controls the channel layer 129 corresponding thereto, and a word line may be electrically connected to the gate electrode 121. The gate electrode 121 may include, for example, a metal material having excellent electrical conductivity such as gold (Au), a metal nitride, impurity-doped silicon, or a two-dimensional (2D) conductive material. However, this is merely an example, and besides, the gate electrode 121 may include various other materials. The interlayer insulating layer 115 may serve as a spacer layer for insulation between the gate electrodes 121. The interlayer insulating layer 115 may include, for example, silicon oxide or silicon nitride, but is not limited thereto.

Channel holes are formed to pass through the interlayer insulating layers 115 and the gate electrodes 121 in a direction (z-axis direction) perpendicular to the substrate 101. Such a channel hole may be formed to have, for example, a circular cross section.

The blocking insulating layer 123, the charge trap layer 125, the tunneling barrier layer 127, and the channel layer 129 are sequentially provided on the inner wall of the channel hole. Here, each of the blocking insulating layer 123, the charge trap layer 125, the tunneling barrier layer 127, and the channel layer 129 may be formed to have a cylindrical shape extending in a direction perpendicular to the substrate 101. A filling insulating layer 130 may be provided inside the channel layer 129 to fill the channel hole. The filling insulating layer 130 may include, for example, silicon oxide or air, but is not limited thereto.

The channel layer 129 may include a semiconductor material. For example, the channel layer 129 may include, for example, Si, Ge, SiGe, group III-V semiconductor, etc. Also, the channel layer 129 may include, for example, an oxide semiconductor, a nitride semiconductor, an oxynitride semiconductor, a 2D semiconductor material, a quantum dot, or an organic semiconductor. Here, the oxide semiconductor may include, for example, InGaZnO, etc., the 2D semiconductor material may include, for example, transition metal dichalcogenide (TMD) or graphene, and the quantum dot may include a colloidal QD, a nanocrystal structure, etc. However, this is only an example, and the present embodiment is not limited thereto.

The channel layer 129 may further include a dopant. Here, the dopant may include a p-type dopant or an n-type dopant. The p-type dopant may include, for example, a Group III element such as B, Al, Ga, and In, and the n-type dopant may include a Group V element, such as P, As, and Sb.

The blocking insulating layer 123, the charge trap layer 125, and the tunneling barrier layer 127 are provided between the gate electrodes 121 and the channel layer 129. The blocking insulating layer 123 is provided on the inner wall of the channel hole to contact the interlayer insulating layers 115 and the gate electrodes 121. The blocking insulating layer 123 may include, for example, silicon oxide or metal oxide, but is not limited thereto. The tunneling barrier layer 127 is a layer through which charges are tunneled, and may include, for example, silicon oxide or metal oxide, but is not limited thereto.

The charge trap layer 125 is provided between the blocking insulating layer 123 and the tunneling barrier layer 127. The charge trap layer 125 may include silicon oxynitride including metal. Here, the metal may include Ga. The metal may include In, or may include Ga and In. The content of the metal included in the charge trap layer 125 may be approximately about 0.5 atomic percent (at %) to about 20 at %, but is not limited thereto. For example, the amount of the metal included in the charge trap layer 125 may be approximately 8 at % to 16 at %. The metal and silicon constituting the charge trap layer 125 may be uniformly distributed inside the charge trap layer 125 or may be distributed in a layer-by-layer (LBL) structure.

The charge trap layer 125 may include silicon nitride including at least one of Ga or In. Here, the content of the metal included in the charge trap layer 125 may be approximately about 0.5 at % to about 20 at % (e.g., approximately 8 at % to 16 at %), but is not limited thereto.

When the charge trap layer 125 includes silicon oxynitride (or silicon nitride) including at least one of Ga or In, compared to an existing charge trap layer including only silicon oxynitride (or silicon nitride), the trap energy and the trap density may increase. The trap energy refers to a voltage barrier that electrons need to cross to move from one atom to another in a material, and the trap density refers to the number of trapped charges per unit volume.

In the vertical NAND flash memory device 100 according to an embodiment, the charge trap layer 125 is formed of silicon oxynitride (or silicon nitride) including at least one of Ga or In, and thus, the trap energy and the trap density may increase, and accordingly, the high-efficiency vertical NAND flash memory device 100 may be implemented. Specifically, charge retention characteristics may be improved due to an increase in the trap energy, and thus, high integration may be implemented by reducing the distance between the gate electrodes 121. Also, a larger amount of charges may be stored due to the increase in the trap density.

Hereinafter, characteristics of a charge trap layer (GaSiON thin film or GaSiN thin film) according to an embodiment obtained through experiments and simulations based on a density functional theory are described. In the following results, an example of using Ga as the metal included in the charge trap layer has been described, but it is also possible to use In or Ga and In as the metal included in the charge trap layer.

Figure 4:
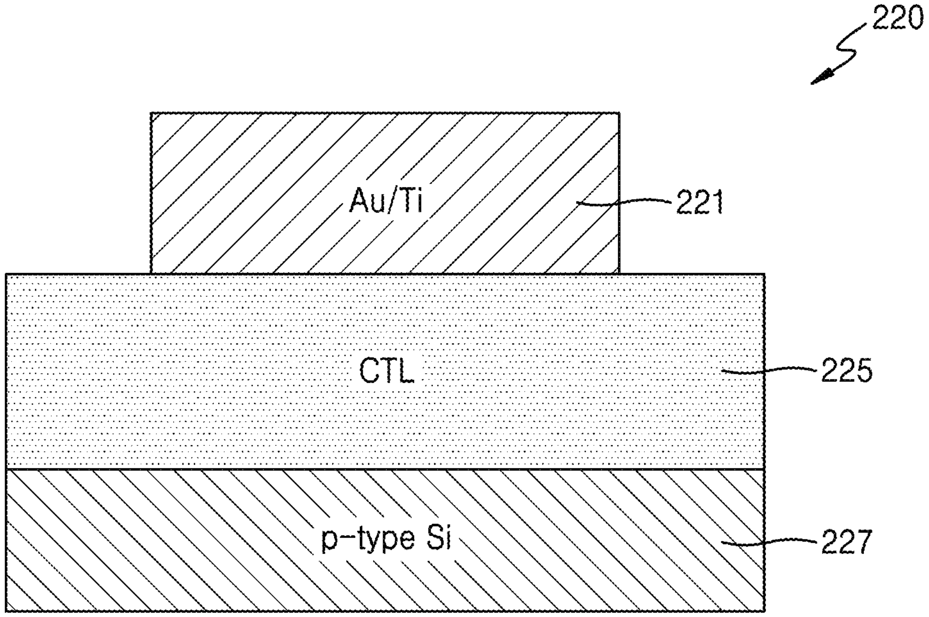
FIG. 4 is a cross-sectional view of a device manufactured for characterization of a charge trap layer.

FIG. 4 is a cross-sectional view of a device 220 manufactured for characterization of the charge trap layer.

Referring to FIG. 4, the device 220 has a structure in which the charge trap layer (CTL) 225 is provided between a p-type Si layer 227 which is a channel layer and an Au/Ti layer 221 which is a gate electrode.

Figure 5:
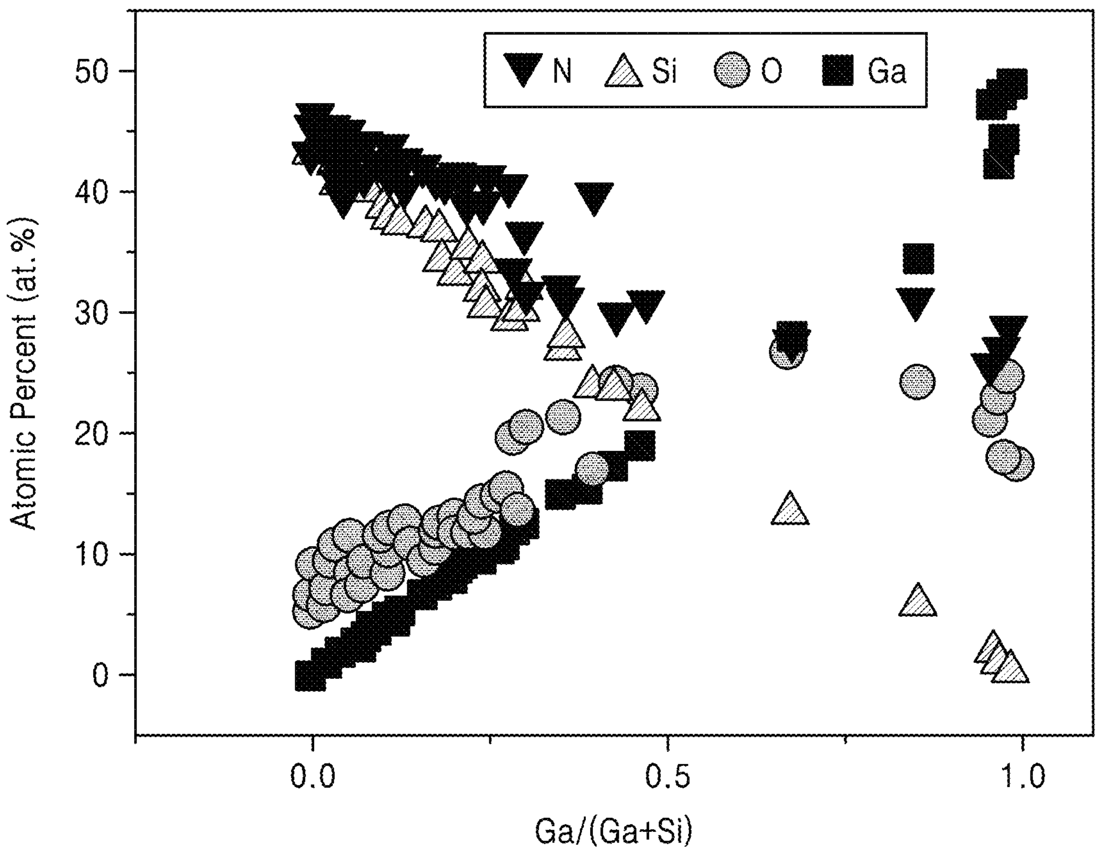
FIG. 5 illustrates changes in compositions of Si, O, and N according to a change in Ga content in a charge trap layer (GaSiON thin film) according to an embodiment.

FIG. 5 illustrates changes in composition of Si, O, and N according to a change in Ga content when the charge trap layer 225 is formed as a GaSiON thin film according to an embodiment. Here, the GaSiON thin film was formed by alloying Ga elements with a SiN thin film using a Co-sputtering method under an oxygen atmosphere. In this case, Ga and Si may be uniformly distributed within the GaSiON thin film.

Referring to FIG. 5, it may be seen that the content of Si and N may decrease and the content of O may increase so that the Ga content increases in the GaSiON thin film.

In order to extract trap energy $E_T$ and trap density $N_T$ of the charge trap layer (GaSiON thin film) according to an embodiment, the Poole-Frenkel Conduction Equation (Equation 1) and a charge pumping method are utilized.

$$J = q\mu N_c E \exp\left(\frac{-q\left(E_T - \sqrt{qE/\pi\varepsilon}\right)}{\kappa T}\right) \quad \text{(equation 1)}$$

(J: current Density, q: electronic charge, μ: carrier mobility $N_c$: density of states in conduction band, E: electric field, $E_T$: trap energy, ε: permittivity, κ: Boltzmann constant, T: temperature)

Figure 6A:
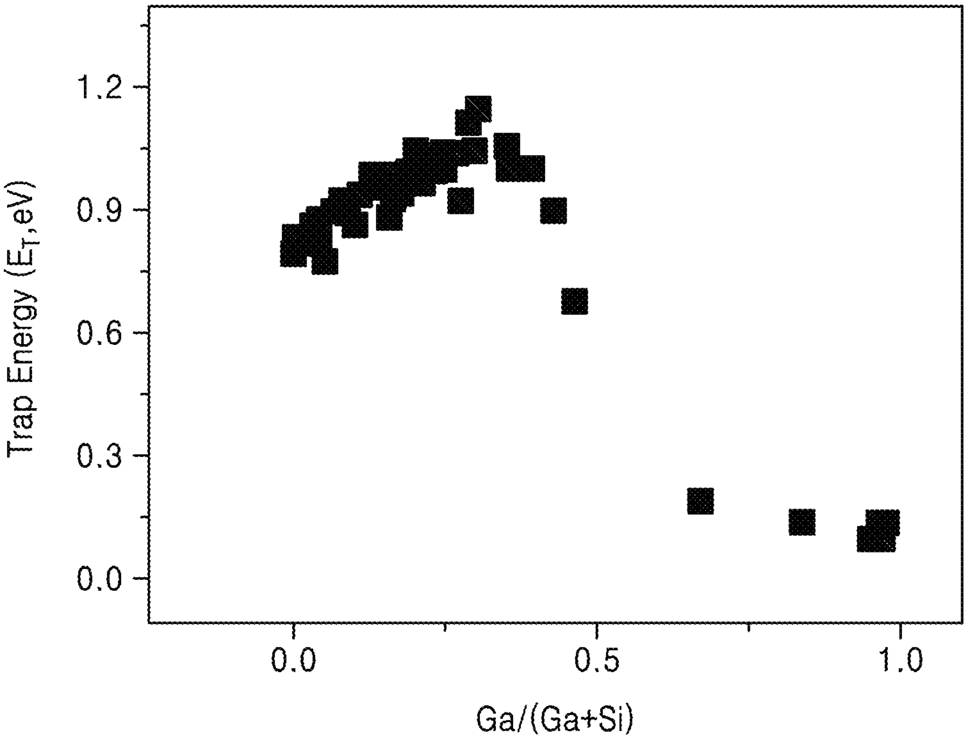
FIG. 6A illustrates a change in trap energy according to a change in Ga content in a charge trap layer (GaSiON thin film) according to an embodiment.
Figure 6B:
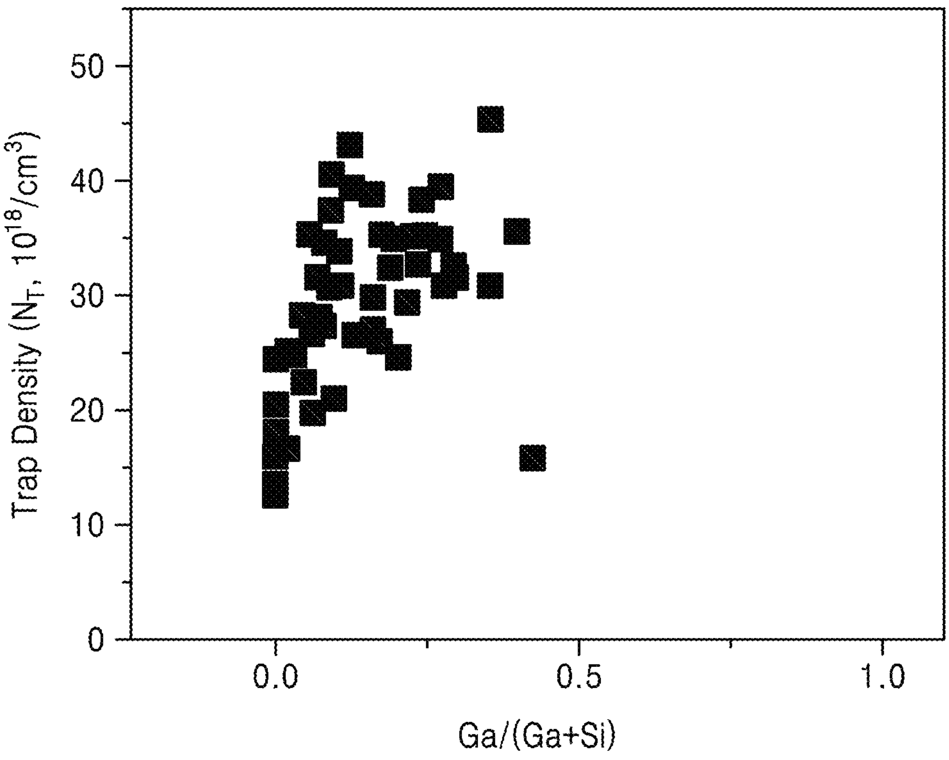
FIG. 6B illustrates a change in trap density according to a change in Ga content in a charge trap layer (GaSiON thin film) according to an embodiment.

FIG. 6A illustrates a change in the trap energy $E_T$ according to a change in Ga content in a charge trap layer (GaSiON thin film) according to an embodiment. FIG. 6A shows a result of calculating the trap energy $E_T$ using the above-described Equation 1. FIG. 6B illustrates a change in the trap density $N_T$ according to a change in Ga content in a charge trap layer (GaSiON thin film) according to an embodiment. FIG. 6B shows a result of calculating the trap density $N_T$ using the charge pumping method.

Referring to FIGS. 6A and 6B, it may be seen that in the GaSiON thin film including Ga, when the Ga content is within a specific range (e.g., a range in which Ga/(Ga+Si) is greater than approximately 0 and smaller than approximately 0.5), the trap energy $E_T$ and trap density $N_T$ are improved compared to a silicon nitride (SiN) thin film.

Figure 7:
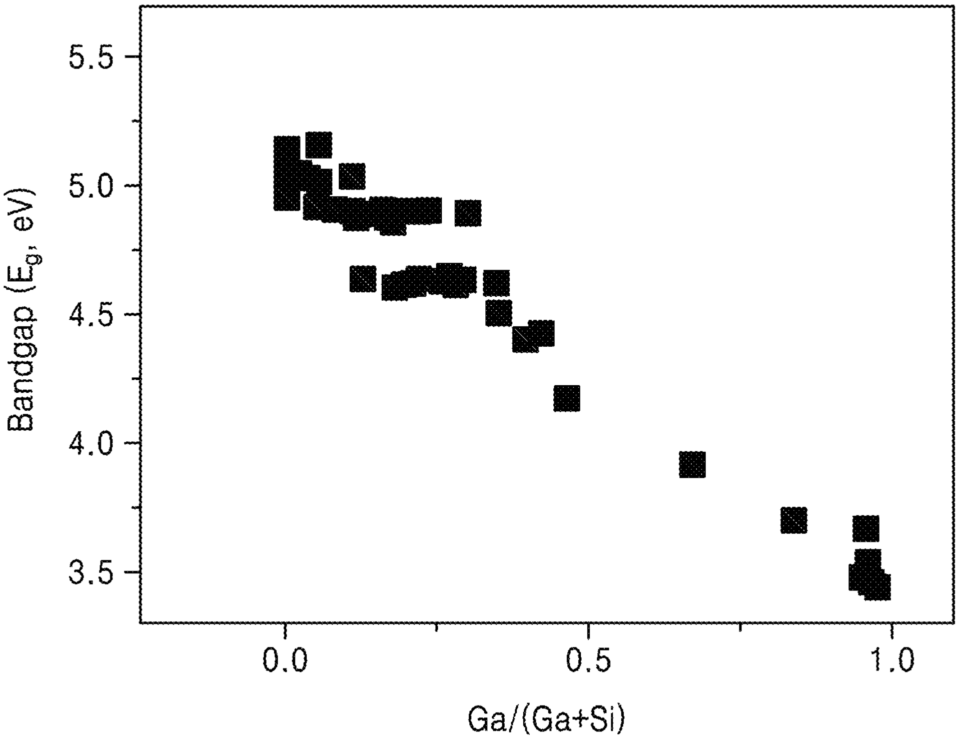
FIG. 7 illustrates a change in a band gap according to a change in Ga content in a charge trap layer (GaSiON thin film) according to an embodiment.

FIG. 7 illustrates a change in a band gap $E_g$ according to a change in Ga content in a charge trap layer (GaSiON thin film) according to an embodiment.

Referring to FIG. 7, it has been confirmed that as the Ga content in the GaSiON thin film increases, the band gap $E_g$ tends to decrease compared to the silicon nitride (SiN) thin film.

Figure 8A:
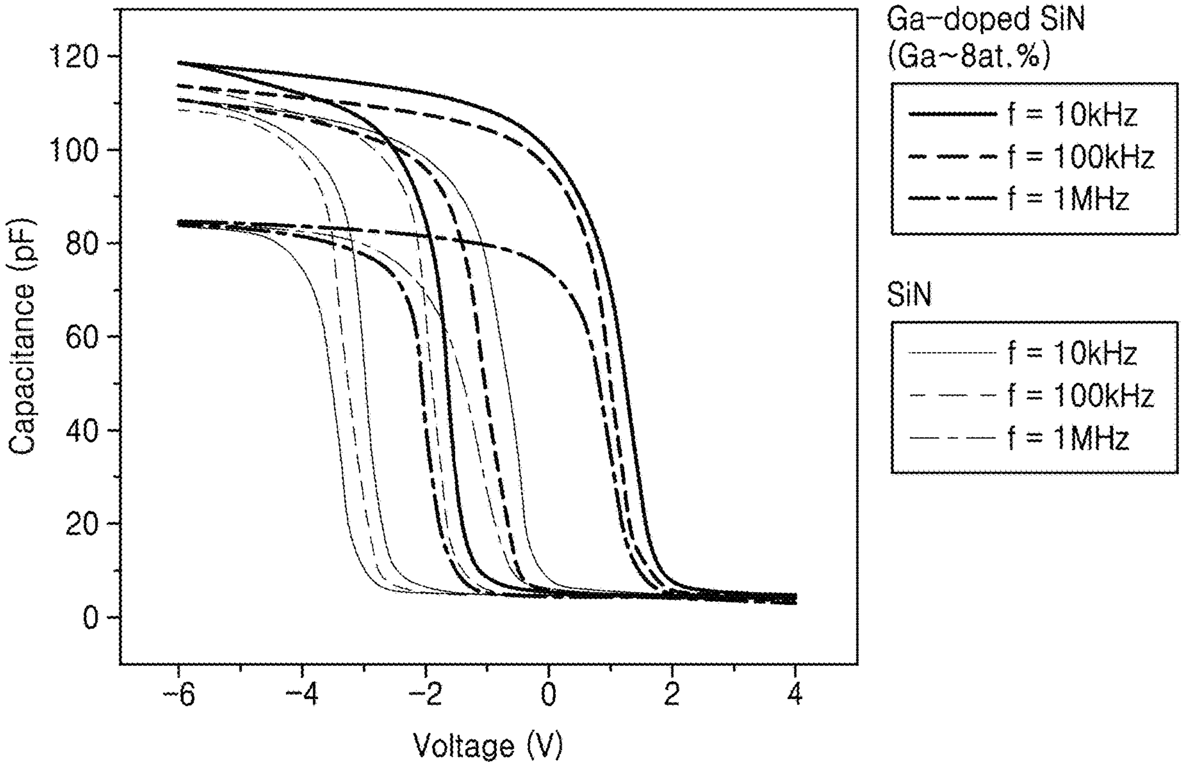
FIG. 8A shows a comparison between C-V characteristics of an existing charge trap layer (SiN thin film) and a charge trap layer (Ga-doped SiN thin film) according to an embodiment.

FIG. 8A shows a comparison between C-V characteristics of an existing charge trap layer (SiN thin film) and a charge trap layer (Ga-doped SiN thin film) according to an embodiment. FIG. 8A shows results of measuring C-V characteristics when the charge trap layer 225 is formed as the silicon nitride (SiN) thin film and C-V characteristics when the charge trap layer 225 is formed as a silicon nitride (Ga-doped SiN) thin film including Ga according to an applied voltage frequency f. The Ga-doped SiN thin film was formed by alloying the Ga element with the SiN thin film by co-sputtering method. FIG. 8A shows the results when the Ga content in the Ga-doped SiN thin film is 8 at %.

Figure 8B:
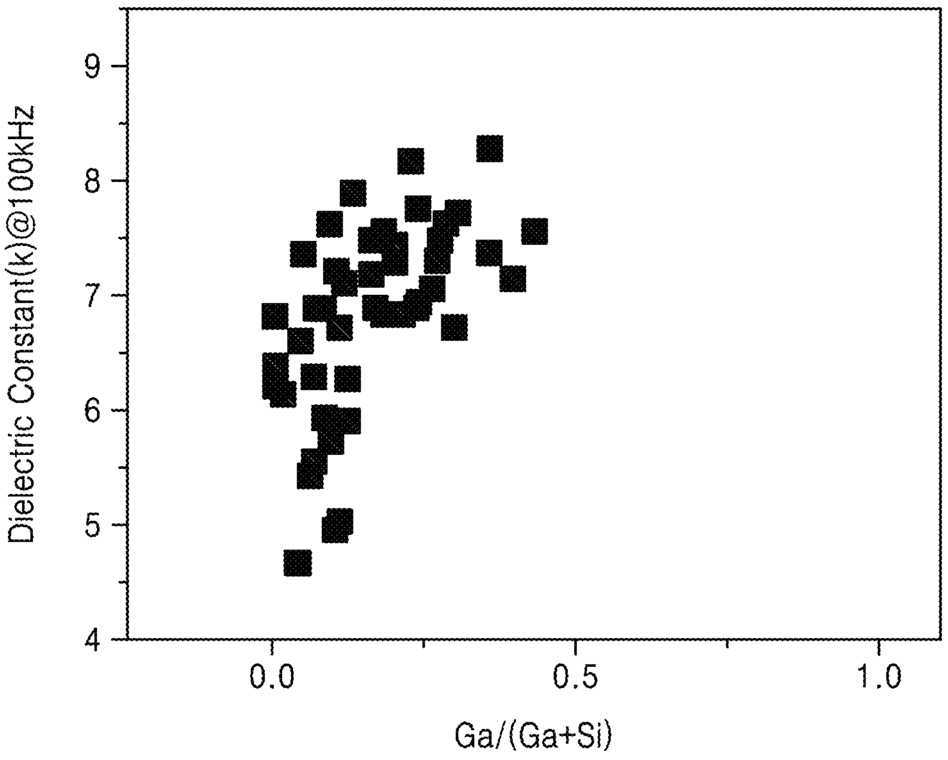
FIG. 8B shows a change in a dielectric constant of a Ga-doped SiN thin film according to a change in Ga content extracted from the C-V characteristics shown in FIG. 8A.

FIG. 8B shows a change in a dielectric constant of a Ga-doped SiN thin film according to a change in Ga content extracted from the C-V characteristics shown in FIG. 8A. Referring to FIGS. 8A and 8B, it may be seen that the dielectric constant increases compared to the SiN thin film so that the Ga content in the SiN thin film may increase.

Figure 9:
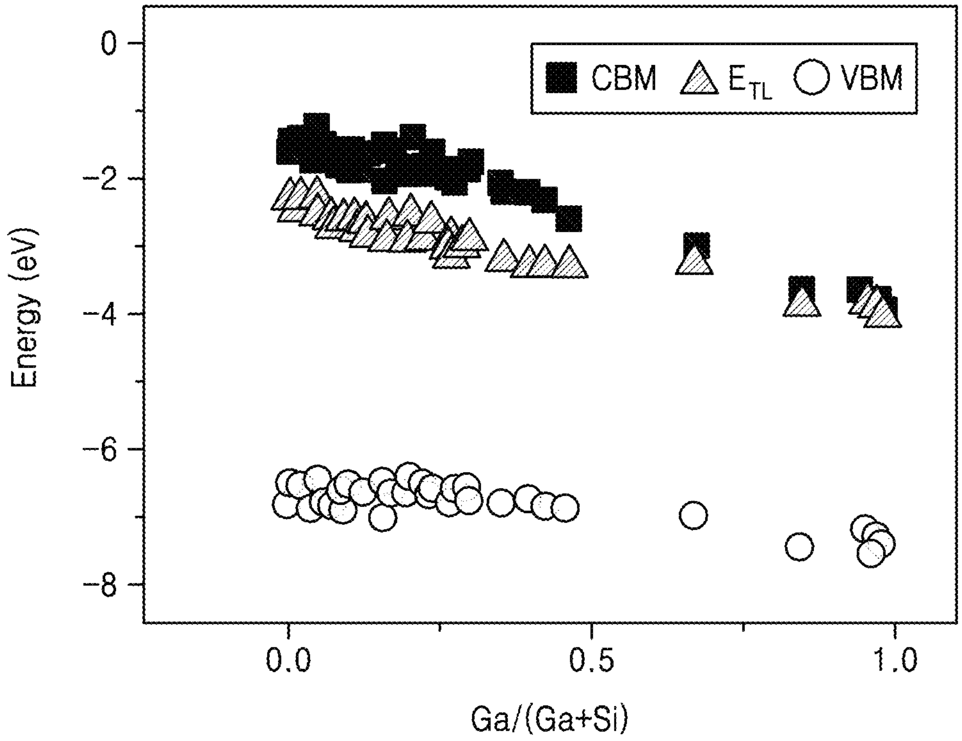
FIG. 9 shows changes in a conduction band minimum (CBM), ETL (position of trap level on a band diagram), and a valence band maximum (VBM) according to a change in Ga content in a charge trap layer (Ga-doped SiN thin film) according to an embodiment.

FIG. 9 shows changes in a conduction band minimum (CBM), a position ETL of trap level on a band diagram, and a valence band maximum (VBM) according to a change in Ga content in a charge trap layer (Ga-doped SiN thin film) according to an embodiment. Referring to FIG. 9, it has been confirmed that the CBM, ETL, and VBM of the Ga-doped SiN thin film tend to decrease as the Ga content increases.

In the above, the case where a GaSiON thin film or a GaSiN thin film is formed by alloying Ga with a SiN thin film as a charge trap layer using a co-sputtering method has been described. The charge trap layer may form the GaSiON thin film or the GaSiN thin film by alternately depositing and alloying SiN and GaN in a LBL structure.

[Table 1] below shows results of measuring the trap energy $E_T$ and the band gap $E_g$ of the GaSiON thin film formed by adjusting the number of GaN layers in the SiN thin film having a thickness of 15 nm to 20 nm by using the LBL deposition method.

Referring to [Table 1], it has been confirmed that as the number of GaN layers in the SiN thin film increases, the Ga content in the GaSiON thin film increases and as the Ga content increases, the trap energy $E_T$ tends to gradually increase and the band gap $E_g$ tends to decrease.

TABLE 1

| Sample | $E_T$ (eV) | $E_g$ (eV) |
|---|---|---|
| SiN | 0.821 | 5.00 |
| GaN 5 Layer | 0.847 | 4.99 |
| GaN 10 Layer | 0.800 | 5.04 |
| GaN 14 Layer | 0.850 | 4.98 |
| GaN 23 Layer | 1.009 | 4.93 |
| GaN 40 Layer | 1.103 | 4.92 |

Figure 10:
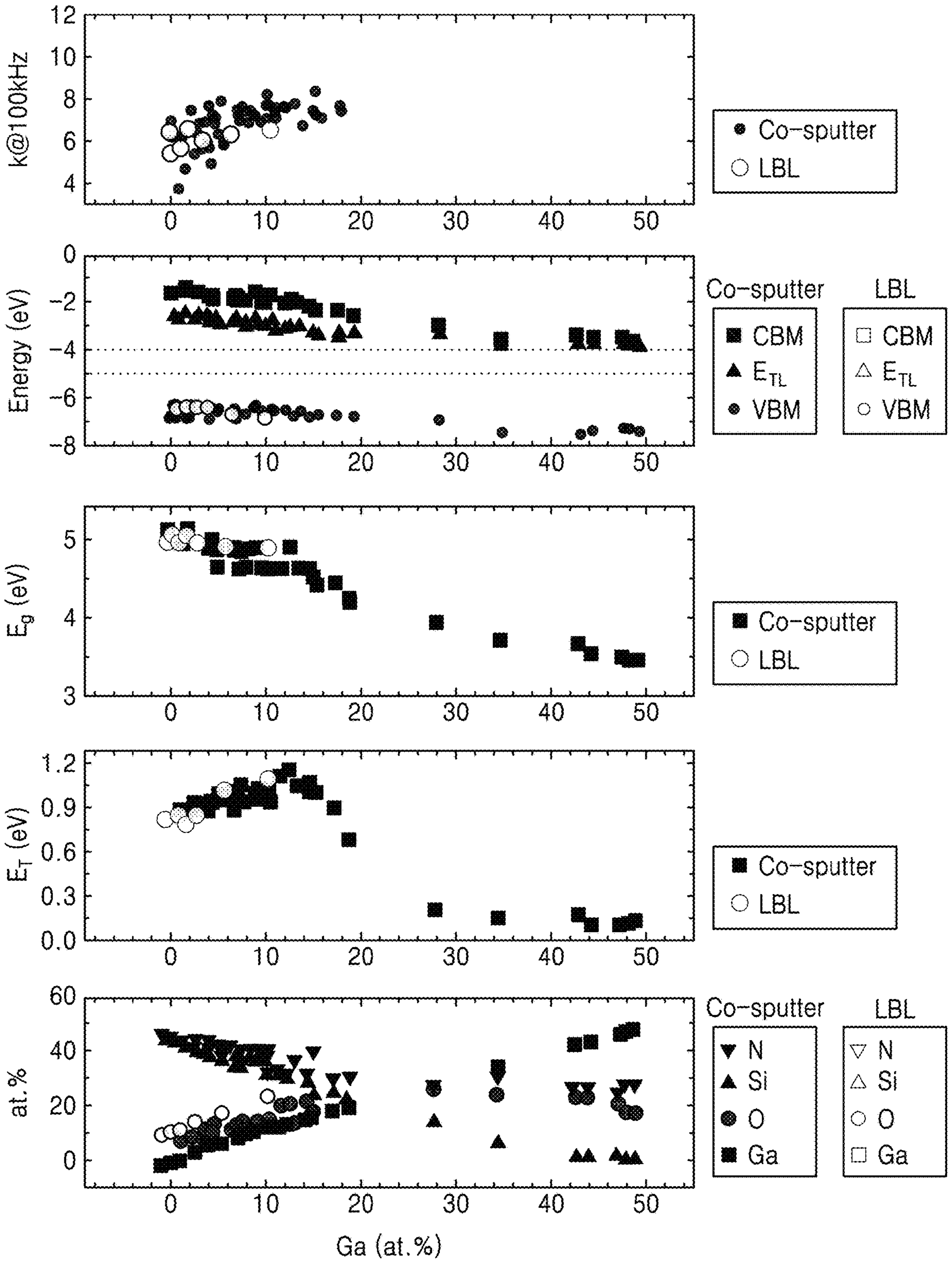
FIG. 10 shows a comparison of optical and electrical characteristics between a GaSiON thin film formed by a co-sputtering deposition method and a GaSiON thin film formed by an LBL deposition method.

FIG. 10 shows a comparison in optical and electrical characteristics between a GaSiON thin film formed by a co-sputtering deposition method and a GaSiON thin film formed by using an LBL deposition method.

Referring to FIG. 10, it may be seen that the GaSiON thin film formed by the Co-sputtering deposition method and the GaSiON thin film formed by the LBL deposition method exhibit similar optical and electrical characteristics.

It may be seen that as the content of Ga increases, a dielectric constant k of the GaSiON thin film gradually increases compared to that of the SiN thin film. It may be seen that as the Ga content increases, the CBM, ETL, the VBM, and the band gap $E_g$ of the GaSiON thin film decrease compared to those of the SiN thin film. It may be seen that when the Ga content is within a specific range (e.g., approximately about 0.5 at % to about 20 at %), the GaSiON thin film has a higher trap energy $E_T$ than the SiN thin film.

As described above, in the vertical NAND flash memory device 100 according to an embodiment, the charge trap layer 125 is formed of silicon oxynitride (or silicon nitride) including at least one of Ga or In, and thus, the trap energy and the trap density may increase, and the high-efficiency vertical NAND flash memory device 100 may be implemented. That is, charge retention characteristics may be improved due to an increase in the trap energy, and thus, high integration may be implemented by reducing the distance between the gate electrodes 121, and a larger amount of charges may be stored in the charge trap layer 125 due to the increase in the trap density.

Figure 11:
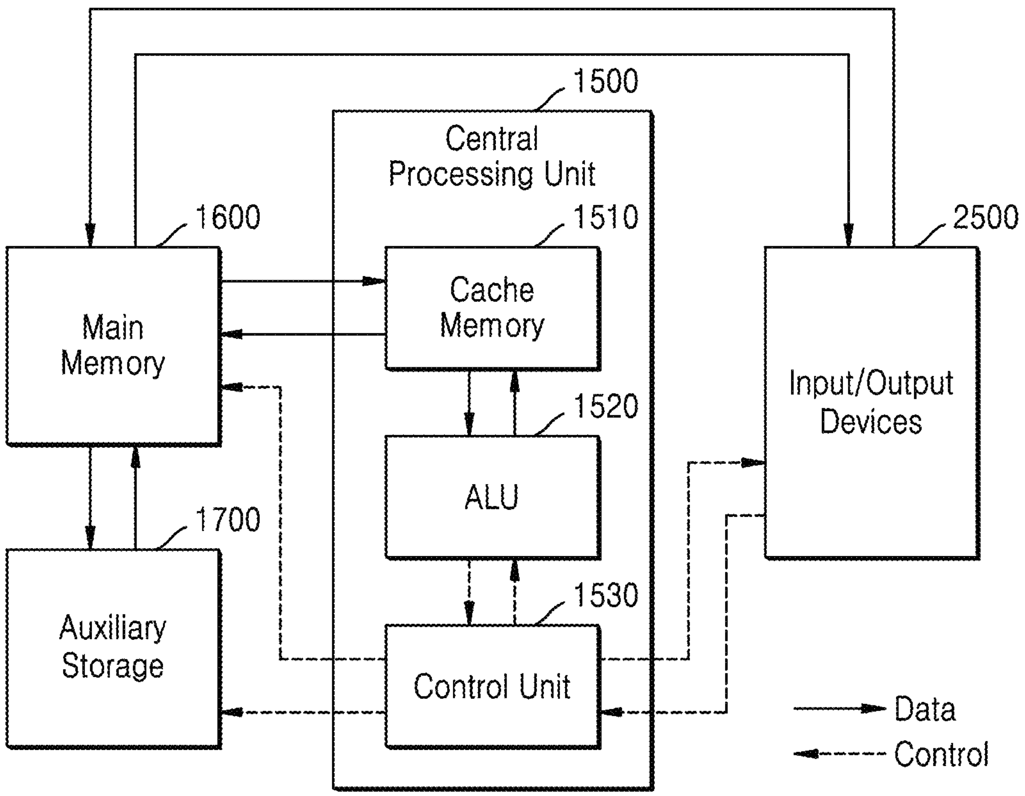
FIG. 11 is a conceptual diagram schematically illustrating a device architecture applicable to an electronic device according to an embodiment.

The vertical NAND flash memory device 100 described above may be used for data storage in various electronic devices. FIG. 11 is a conceptual diagram schematically illustrating a device architecture applicable to an electronic device according to an embodiment.

Referring to FIG. 11, a cache memory 1510, an ALU 1520, and a control unit 1530 may constitute a central processing unit (CPU) 1500, and the cache memory 1510 may include a static random access memory (SRAM). Apart from the CPU 1500, a main memory 1600 and an auxiliary storage 1700 may be provided. The main memory 1600 may include a DRAM device, and the auxiliary storage 1700 may include the vertical NAND flash memory device 100 described above. In some cases, the device architecture may be implemented in a form in which computing unit devices and memory unit devices are adjacent to each other in one chip without distinguishing sub-units. One or more input/output device 2500 (e.g., keyboard, display, mouse) may be connected to the main memory 1600, auxiliary storage 1700, and/or CPU 1500.

Figure 12:
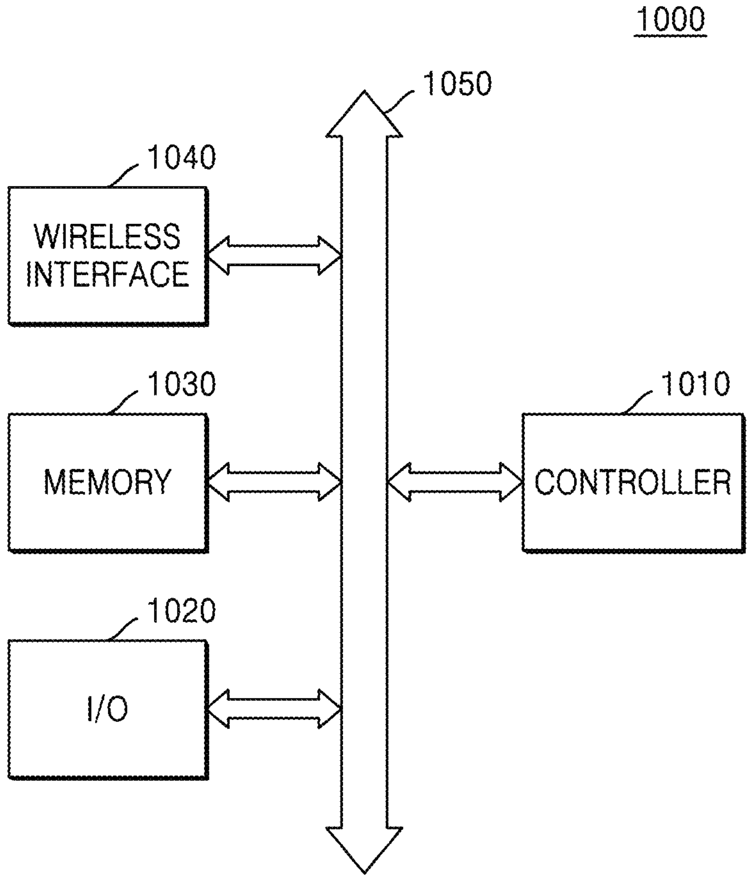
FIG. 12 is a block diagram of an electronic system equipped with a vertical NAND flash memory device according to an embodiment.

FIG. 12 is a block diagram of an electronic system equipped with a vertical NAND flash memory device according to an embodiment.

Referring to FIG. 12, the electronic system 1000 may constitute a wireless communication device or a device capable of transmitting and/or receiving information in a wireless environment. The electronic system 1000 includes a controller 1010, an input/output device (I/O) 1020, a memory 1030, and a wireless interface 1040, and these components may be interconnected to each other through a bus 1050.

The controller 1010 may include at least one of a microprocessor, a digital signal processor, and a processing device similar thereto. The I/O device 1020 may include at least one of a keypad, a keyboard, and a display. The memory 1030 may be used to store instructions executed by controller 1010. For example, the memory 1030 may be used to store user data. The electronic system 1000 may use the wireless interface 1040 to transmit/receive data through a wireless communication network. The wireless interface 1040 may include an antenna and/or a wireless transceiver. In some embodiments, the electronic system 1000 may be used in a communication interface protocol of a third-generation communication system such as code division multiple access (CDMA), global system for mobile communications (GSM), north American digital cellular (NADC), extended-time division multiple access (E-TDMA), wide band code division multiple access (WCDMA), a 4G (4th Generation) communication system such as 4G LTE, a 5G (5th Generation) communication system, a wired local area network (LAN), a wireless local area network (WLAN), such as Wi-Fi (Wireless Fidelity), a wireless personal area network (WPAN), such as Bluetooth, Wireless USB (Wireless Universal Serial Bus), Zigbee, Near Field Communication (NFC), Radio-frequency identification (RFID), and/or Power Line communication (PLC).

The memory 1030 of the electronic system 1000 may include the vertical NAND flash memory device 100 described above.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A vertical NAND flash memory device comprising:
a plurality of cell arrays, wherein
each of the plurality of cell arrays includes a channel layer,
a charge trap layer on the channel layer, and
a plurality of gate electrodes on the charge trap layer,
the charge trap layer includes silicon oxynitride comprising a metal dopant, and the metal dopant comprises at least one of Ga or In,
wherein the metal dopant and silicon are uniformly distributed throughout the charge trap layer in a single continuous layer;
wherein a content of the metal dopant in the charge trap layer is about 0.5 at % to about 20 at % by adjusting a number of the metal doped nitride layers in the silicon oxynitride having a thickness of 15 nm to 20 nm.

2. The vertical NAND flash memory device of claim 1, wherein the content of the metal dopant in the charge trap layer is about 8 at % to about 16 at %.

3. The vertical NAND flash memory device of claim 1, further comprising:
a substrate, wherein
each of the plurality of cell arrays is vertically disposed on the substrate.

4. The vertical NAND flash memory device of claim 3, wherein
an inside of the channel layer includes a channel hole extending in a direction perpendicular to the substrate.

5. The vertical NAND flash memory device of claim 4, wherein
in each of the plurality of cell arrays, the channel hole is filled with a filling insulating layer.

6. The vertical NAND flash memory device of claim 4, wherein
the channel layer and the charge trap layer each have a cylindrical shape and surround the channel hole.

7. The vertical NAND flash memory device of claim 6, wherein
in each of the plurality of cell arrays, a tunneling barrier layer is between the channel layer and the charge trap layer.

8. The vertical NAND flash memory device of claim 7, wherein
in each of the plurality of cell arrays, the plurality of gate electrodes are spaced apart from each other in the direction perpendicular to the substrate, and each of the plurality of gate electrodes surrounds the charge trap layer.

9. The vertical NAND flash memory device of claim 8, wherein
in each of the plurality of cell arrays, a blocking insulating layer is between the charge trap layer and each of the plurality of gate electrodes.

10. An electronic device comprising:
the vertical NAND flash memory device of claim 1.

11. A vertical NAND flash memory device comprising:
a plurality of cell arrays, wherein
each of the plurality of cell arrays includes a channel layer,
a charge trap layer on the channel layer, and
a plurality of gate electrodes on the charge trap layer, the charge trap layer includes silicon nitride comprising a metal dopant, and the metal dopant comprises at least one of Ga or In, wherein the metal dopant and silicon are uniformly distributed throughout the charge trap layer in a single continuous layer;

wherein a content of the metal dopant in the charge trap layer is about 0.5 at % to about 20 at % by adjusting a number of the metal doped nitride layers in the silicon nitride having a thickness of 15 nm to 20 nm.

12. The vertical NAND flash memory device of claim 11, further comprising:

a substrate, wherein each of the plurality of cell arrays extends vertically on the substrate.

13. The vertical NAND flash memory device of claim 12, wherein an inside of the channel layer includes a channel hole extending in a direction perpendicular to the substrate, and the channel layer and the charge trap layer each have a cylindrical shape and surround the channel hole.

14. The vertical NAND flash memory device of claim 13, wherein in each of the plurality of cell arrays, a tunneling barrier layer is between the channel layer and the charge trap layer, and a blocking insulating layer is between the charge trap layer and each of the plurality of gate electrodes.

15. The vertical NAND flash memory device of claim 13, wherein in each of the plurality of cell arrays, the plurality of gate electrodes are spaced apart from each other in the direction perpendicular to the substrate, and each of the plurality of gate electrodes surrounds the charge trap layer.

* * * * *